(12) United States Patent
Poulin et al.

(10) Patent No.: US 6,304,130 B1
(45) Date of Patent: Oct. 16, 2001

(54) BIAS CIRCUIT FOR DEPLETION MODE FIELD-EFFECT TRANSISTORS

(75) Inventors: Darcy Poulin, Carp; Gord G. Rabjohn, Ottawa; Somsack Sychaleun, Ontario, all of (CA)

(73) Assignee: Nortel Networks Limited, St-Laurent (CA)

( * ) Notice: Subject to any disclaimer, the term of this patent is extended or adjusted under 35 U.S.C. 154(b) by 0 days.

(21) Appl. No.: 09/471,137

(22) Filed: Dec. 23, 1999

(51) Int. Cl.[7] .................................................. H03K 17/56
(52) U.S. Cl. ........................ 327/430; 327/530; 330/296
(58) Field of Search ................................... 327/427, 430, 327/307, 431, 530; 330/277, 296

(56) References Cited

U.S. PATENT DOCUMENTS

| 5,361,007 | 11/1994 | Ohta | 327/427 |
|---|---|---|---|
| 5,506,544 | 4/1996 | Staudinger et al. | 330/277 |
| 5,724,004 | * 3/1998 | Reif et al. | 330/277 |
| 5,751,181 | * 5/1998 | Maemura et al. | 327/427 |
| 5,757,236 | 5/1998 | Ortiz et al. | 330/296 |
| 5,808,515 | 9/1998 | Tsuruoka et al. | 330/277 |

* cited by examiner

Primary Examiner—Terry D. Cunningham

(57) ABSTRACT

The present invention relates to a bias circuit for biasing a depletion mode power transistor. The bias circuit includes a voltage offset circuit and a transistor, where the voltage offset circuit is serially coupled between the gate terminal of the depletion mode power transistor and the drain terminal of the transistor. The bias circuit generates a bias voltage that, when applied to the gate terminal of the depletion mode power transistor, maintains a substantially constant drain current through the power transistor over a range of threshold voltages caused by process and temperature variations.

41 Claims, 2 Drawing Sheets

BIAS CIRCUIT FOR DEPLETION MODE FIELD-EFFECT TRANSISTORS

FIELD OF THE INVENTION

The present invention relates to the field of depletion mode transistor circuits. More specifically, it pertains to a bias circuit for depletion mode field-effect transistors.

BACKGROUND OF THE INVENTION

It is well known that the DC characteristics of Field-Effect Transistors (FETs) in general, and GaAs Metal-Semiconductor FETs (Gallium Arsenide MESFETs) in particular, can not be controlled to arbitrarily tight tolerances. The FETs on a given wafer, and even within a given chip, will exhibit differences in DC and Radio Frequency (RF) characteristics, developed during processing of the FET. In the case of a MOSFET, these differences are due to changes in gate oxide thickness, channel doping and impurities in the channel and oxide. In the case of a GaAs MESFET, these differences are due to changes in gate length, impurities in the channel and different channel doping levels. Much of the evolution in circuit design over the past 50 years has dealt with designing circuits that are tolerant of these variations.

GaAs FETs have excellent high frequency characteristics, making them especially suitable for use at high frequencies in applications such as RF amplifiers and mixers. In these circuits, many traditional techniques that make circuits immune to device variations, such as differential circuitry, can not be used for various reasons. In particular, such techniques reduce dynamic range, increase power dissipation, degrade noise figure, degrade linearity and reduce efficiency.

In use, the gate of the FET must be biased for proper operation, in order to achieve maximum efficiency. Due to the above-described limitations on the circuit topologies used for high-frequency applications, many GaAs FET based circuits, even today, rely on very simple biasing circuitry, such as a constant drain bias voltage and a gate bias supplied by some form of a voltage source (which may or may not be controlled). If fixed voltage sources are used, the RF performance of the circuit may vary unacceptably because of differences in the FETs. The use of variable voltage sources (either factory adjusted or adjusted through a feedback loop) overcomes this problem, but is an expensive alternative.

A technique that is becoming more and more popular for biasing GaAs FET based circuits is known as the "tracking bias", whereby a transistor (reference transistor) similar to the transistor being controlled (RF transistor) is connected in a circuit that has feedback for a stable operating point. Since the reference transistor does not operate at RF, several different circuit topologies (that are impossible to implement on a transistor that must handle RF signals) are possible. Since the reference transistor is similar to the RF transistor, the gate voltage that the reference transistor operates at is also suitable for the RF transistor. As long as the temperature of the two transistors is kept the same (and this will be the case if the transistors are located physically close to each other), a change in temperature is also handled appropriately. As long as the processing that the two transistors undergo is the same (and this will be the case if the transistors are located physically close to each other), process variations are handled appropriately.

With respect to the "tracking bias" technique, little power is wasted, as the reference transistor can be made quite small. Other advantages include:

There is no compromise in the design of the RF part of the circuit.

The circuitry is small and can be implemented in an ASIC very inexpensively.

No adjustments are required, and several different implementations can be devised so that the transistor can be operated in constant current or constant Gm operation.

There are no restrictions on the class of operation of the RF circuit.

"Tracking bias" circuits can be made to keep different device parameters constant regardless of process variations, temperature changes, etc. Of course, no circuit can keep all parameters of a transistor constant. These circuits work by varying the bias (generally the gate voltage) on the RF transistor in proportion with one parameter so that variations in another parameter are cancelled out. Generally, designers aim to keep either the transconductance (Gm) or the drain current (Id) constant, or to keep the drain current at a fixed proportion of the saturated drain current (Idss). Keeping these DC parameters constant is sufficient to ensure that RF parameters are also held constant.

An existing "tracking bias" circuit biases the transistor at a constant fraction of the saturated drain current (Idss), and is simpler and less expensive to manufacture. Unfortunately, the circuit is not sensitive to changes in pinchoff voltage, causing excessive current to be drawn for more negative pinchoff voltages and insufficient current to be drawn for more positive pinchoff voltages. In the former case, this causes a decrease in the efficiency of the controlled RF transistor. In the latter case, this causes premature saturation or "clipping" of the input signal.

Another known "tracking bias" circuit biases the transistor at approximately a constant absolute current. Unfortunately, this technique is limited in its range of IS applicability. Specifically, it is limited to RF transistors that have a pinchoff voltage of less than 0.7 volts. The reference transistor operates at a lower current that the RF transistor, so tracking between the reference transistor and the RF transistor may be poor.

The background information provided above clearly indicates that there exists a need in the industry to provide an improved bias circuit for depletion mode field-effect transistors, in order to achieve maximum efficiency of operation.

SUMMARY OF THE INVENTION

The present invention provides a bias circuit for biasing a depletion mode power transistor. The bias circuit includes a voltage offset circuit, a transistor, first and second resistors and first and second power supply connections. A voltage differential may be impressed across the power supply connections in order to energize the bias circuit. The voltage offset circuit has an input and an output, the input being connected to the drain terminal of the transistor and the output to the gate terminal of the depletion mode power transistor. The gate terminal of the transistor is coupled to the first power supply connection. The source terminal of the transistor is also coupled to the first power supply connection, through the first resistor. The drain terminal of the transistor is coupled to the second power supply, through the second resistor. The bias circuit is capable of generating a bias voltage that, when applied to the gate terminal of the power transistor, maintains a is substantially constant drain current through the power transistor.

The voltage offset circuit applies a DC voltage shift to an electrical signal received at the input of the voltage offset circuit.

In this specification, the terms "connected" and "coupled" are equivalent to "in an electrical pathway", where the electrical pathway may or may not include other electrical components, such as resistors, inductors and capacitors, among other possibilities.

Specifically, the improvement in the bias circuit arises from the topology of the bias circuit, whereby the voltage offset circuit is coupled between the drain terminal of the transistor of the bias circuit and the gate terminal of the power transistor. This topology ensures that the transistor of the bias circuit is operating at approximately the same fraction of IDSS of the transistor (the maximum current through the transistor channel) as the biased power transistor. Thus, the bias circuit and the biased power transistor are operating over similar regimes, allowing them to track more efficiently over process variations, In a specific example of implementation, the voltage offset circuit is formed primarily of a diode, connected at its anode to the gate terminal of the power transistor and at its cathode to the drain terminal of the transistor of the bias circuit. The voltage offset circuit also includes current supply circuitry for providing adequate current to the diode. Specifically, the current supply circuitry must ensure that enough current is flowing to maintain the diode in the forward-biased mode, such that a constant forward voltage drop is assured across the diode. In an alternative example of implementation, the diode could be replaced by a resistor.

The bias circuit may be designed using GaAs MESFETS, other types of MESFETS, JFETS or MODFETS, among other possibilities.

In operation, the bias circuit generates a bias voltage at the gate terminal of the power transistor that maintains a substantially constant drain current $I_{DS}$ through the transistor over temperature and process variations. The bias circuit is applicable to any depletion mode field effect transistor circuit, including MESFETs, HEMTs, HFETs, MODFETs, JFETs, etc. Other examples of depletion mode circuits within the scope of the present invention include mixers, oscillators and multipliers, among other possibilities.

BRIEF DESCRIPTION OF THE DRAWINGS

These and other features of the present invention will become apparent from the following detailed description considered in connection with the accompanying drawings. It is to be understood, however, that the drawings are provided for purposes of illustration only and not as a definition of the boundaries of the invention, for which reference should be made to the appending claims.

DESCRIPTION OF A PREFERRED EMBODIMENT

Figure 1:
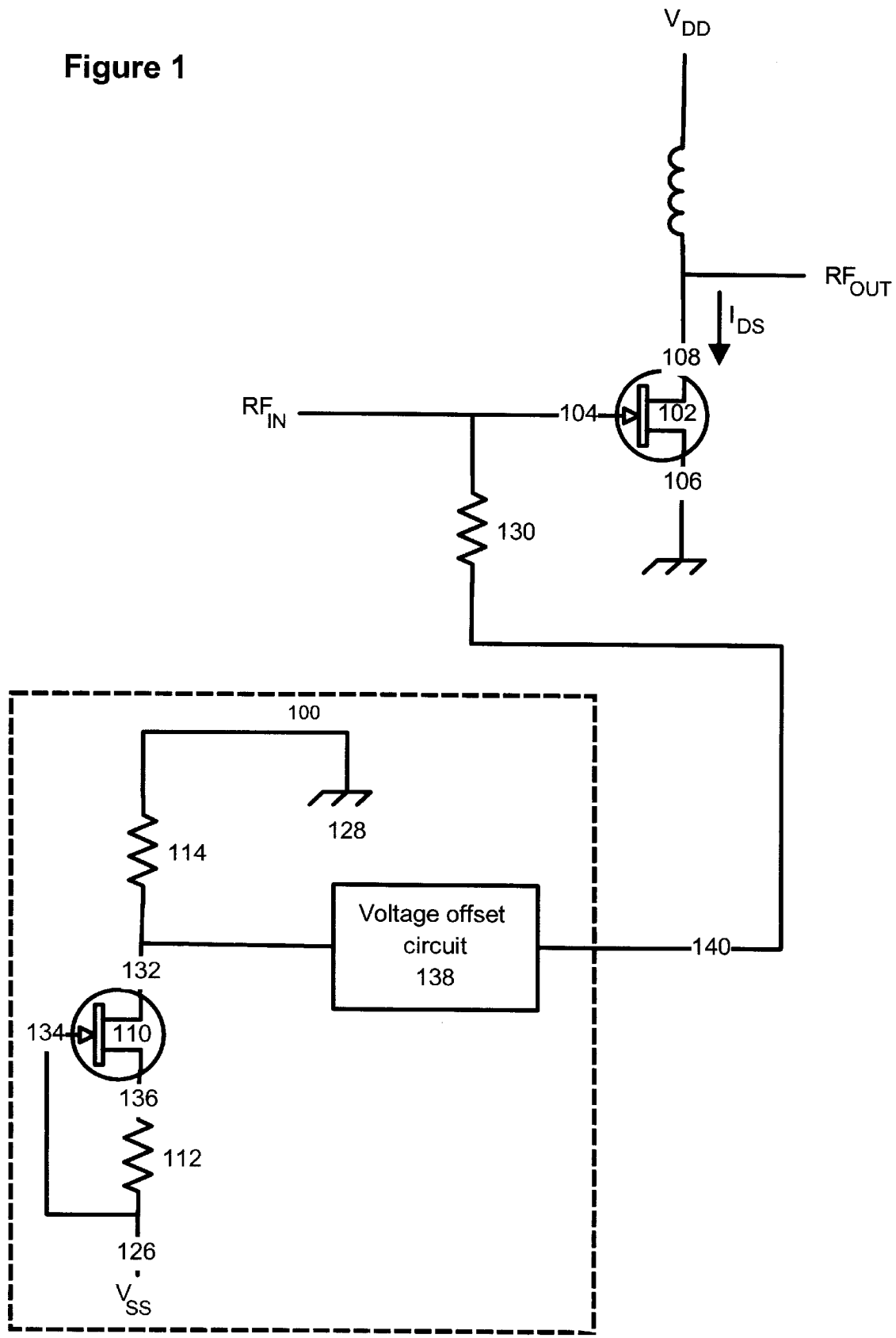
FIG. 1 schematically illustrates a bias circuit for a FET based amplifier, in accordance with an embodiment of the present invention.

FIG. 1 is a circuit diagram of a non-limiting example of implementation of the present invention, specifically an improved bias circuit 100 for biasing a transistor 102. In FIG. 1, the transistor 102 to be biased is one component of a simple RF amplifier circuit, suitable for manufacturing as an integrated circuit (IC) using conventional monolithic IC processes. Alternatively, the transistor 102 could be in use in any other high-frequency FET based application.

Within the RF amplifier circuit, the transistor 102 is a Gallium Arsenide (GaAs) depletion mode MESFET operating as a power device for amplifying a high-frequency signal $RF_{IN}$, and has a gate terminal 104, a source terminal 106 and a drain terminal 108. The high-frequency signal $RF_{IN}$ is received at gate terminal 104 of the FET 102, and the amplified signal $RF_{OUT}$ is taken at the drain terminal 108 of the FET 102.

The bias circuit 100 is coupled to the gate terminal 104 of transistor 102, and sets the bias operating point of the transistor 102. The bias circuit 100 includes a transistor 110, resistors 112, 114 and a voltage offset circuit 138, the latter being serially coupled between the gate terminal 104 of transistor 102 and the drain terminal 132 of transistor 110. The gate terminal 134 of transistor 110 receives power supply connection 126 (a negative supply voltage Vss). The source terminal 136 of transistor 110 is coupled through resistor 112 to power supply connection 126, while the drain terminal 132 of transistor 110 is coupled through resistor 114 to power supply connection 128. Resistor 130 is coupled between the gate terminal 104 of the transistor 102 and the bias circuit 100 to isolate the $RF_{IN}$ signal from the bias circuit 100. A voltage differential is impressed across the power supply connections 126 and 128, in order to energize the bias circuit 100.

The voltage offset circuit 138 is responsible for providing a voltage offset between the drain terminal 132 of the transistor 110 and the gate terminal 104 of the transistor 102, through the application of a positive DC voltage shift to the electrical signal at the drain terminal 132.

Figure 2:
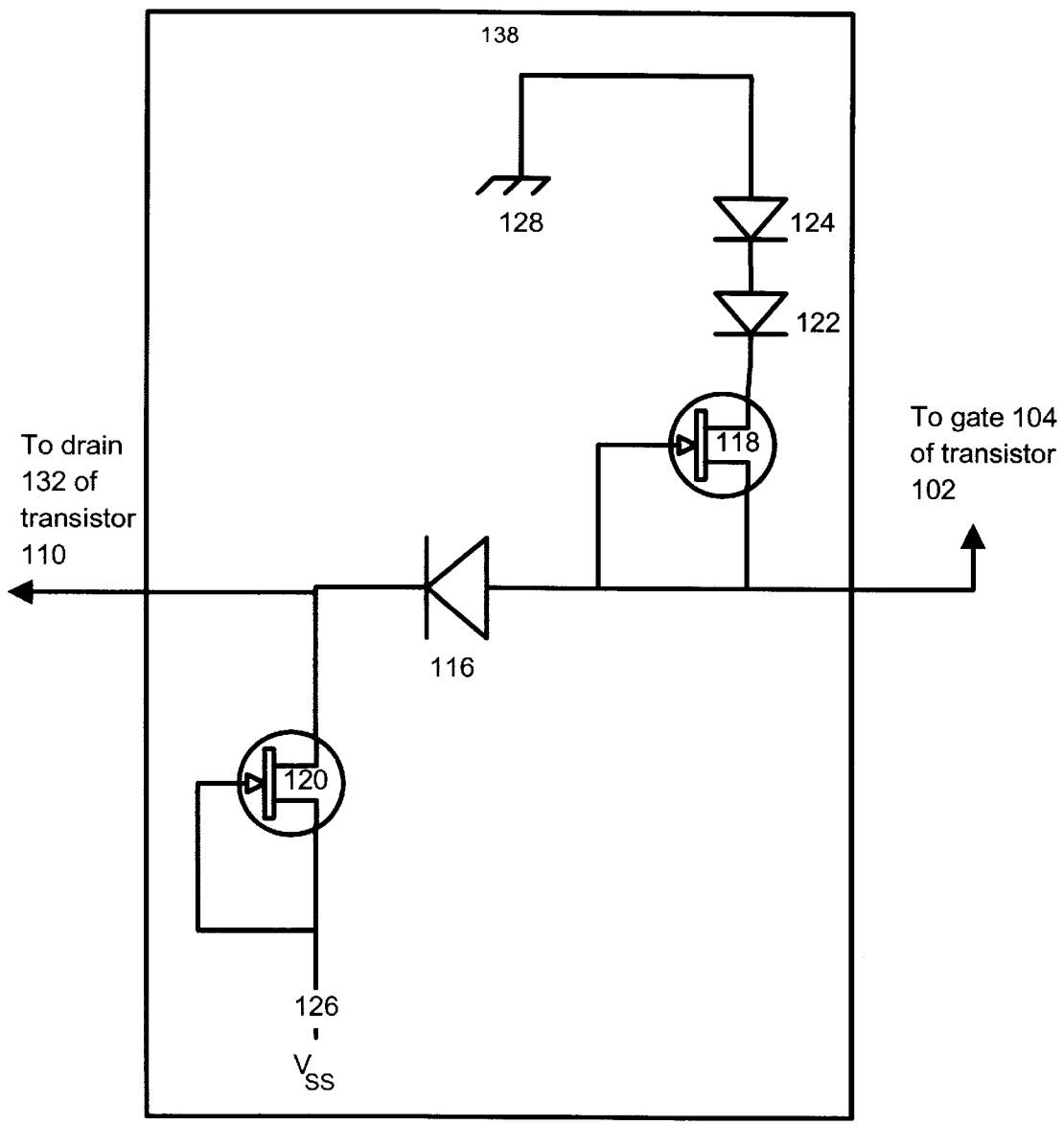
FIG. 2 schematically illustrates the voltage offset circuit shown in FIG. 1, in accordance with an embodiment of the present invention.

Specific to a non-limiting example of implementation shown in FIG. 2, the voltage offset circuit 138 is formed primarily of diode 116, connected at its anode to the gate terminal 104 of transistor 102, through resistor 130, and at its cathode to the drain terminal 132 of transistor 113. Note that, in an alternative example of implementation, diode 116 could be replaced by a transistor configured as a diode, having its drain terminal and source terminal (cathode) coupled together to the drain terminal 132 of transistor 110 and its gate terminal (anode) coupled to the gate terminal 104 of transistor 102, through resistor 130. In yet another alternative example of implementation, diode 116 could be replaced by a resistor.

The voltage offset circuit 138 shown in FIG. 2 also includes current supply circuitry for providing adequate current to the diode 116. Specifically, the current supply circuitry must ensure that enough current is flowing to maintain the diode 116 in the forward-biased mode, such that a constant forward voltage drop is assured across the diode 116. Accordingly, a positive DC voltage shift is provided between the drain terminal 132 of the transistor 110 and the gate terminal 104 of transistor 102.

In the specific example of implementation shown in FIG. 2, the current supply circuitry includes transistors 118, 120 and diodes 122, 124. The gate terminal and source terminal of transistor 118 are coupled together to the anode of diode 116. The drain terminal of transistor 118 is coupled through diodes 122 and 124 to the power supply connection 128. The gate terminal and source terminal of transistor 120 are coupled together to power supply connection 126. The drain terminal of transistor 120 is coupled to the cathode of diode 116. Diodes 122 and 124 ensure that the voltage drops across transistors 118 and 120 are substantially equal. Note that the number of diodes used to equalize the voltage drops across transistors 118 and 120 may vary in dependence of the voltage levels of power supply connection voltages 126, 128, and that these diodes may even be eliminated completely in many cases with little degradation to the circuit performance.

In an alternative example of implementation, transistor 120 is eliminated from the current supply circuitry, and the size of transistor 110 and resistor 112 modified such that adequate current is supplied to the diode 116. In yet another alternative, transistors 118 and 120 are both replaced by high-valued resistors.

Note that the bias circuit 100 may be designed using GaAs MESFETS, other types of MESFETS, JFETS or MODFETS, among other possibilities.

In operation, the bias circuit 100 generates a bias voltage at the gate terminal 104 of transistor 102 that maintains a substantially constant drain current $I_{DS}$ through the transistor 102 over temperature and process variations. Bias circuit 100 is applicable to any depletion mode field effect transistor circuit, including MESFETs, HEMTs, HFETs, MODFETs, JFETs, etc. Other examples of depletion mode circuits within the scope of the present invention include mixers, oscillators and multipliers, among other possibilities.

In theory, a well-known, approximate equation for the drain current $I_D$ of transistor 110 is given by:

$$I_D = g_m*(-V_{th}+V_{gs}) \quad (1)$$

where $g_m$ is the transconductance of the transistor 110, $V_{th}$ is the threshold voltage of the transistor 110 (negative for depletion mode devices) and $V_{gs}$ is the gate terminal to source terminal voltage of the transistor 110.

Looking at the sub-circuit composed of transistor 110 and resistor $R_{112}$, we derive:

$$V_{gs}=R_{112}*I_D \quad (2)$$

$$I_D=g_m*(-V_{th}-I_D*R_{112}) \quad (3)$$

$$I_D(1+g_m*R_{112})=-g_m*V_{th} \quad (4)$$

$$I_D=(-g_m*V_{th})/(1+g_m*R_{112}) \quad (5)$$

Since $V_{th}=-I_{DSS}/g_m$, where $I_{DSS}$ is the saturated drain current for transistor 110, we further derive:

$$I_D=I_{DSS}/(1+g_m*R_{112}) \quad (6)$$

$$I_D/I_{DSS}=1/(1+R_{112}*g_m) \quad (7)$$

Thus, the drain current $I_D$ through transistor 110 is a constant fraction of $I_{DSS}$, for a given $R_{112}$ and $g_m$.

Taking into consideration the second resistor $R_{114}$, and assuming that $R_{114}=R_{112}$, the magnitude of the voltage at the drain terminal 132 of transistor 110 is equal to the gate terminal to source terminal voltage $V_{gs}$ of the transistor 110.

For the purpose of clarification, ignore the presence of voltage offset circuit 138 for the time being. By connecting the bias circuit 100 to the gate terminal 104 of an RF transistor 102, where the transistor 102 has a source terminal 106 that is connected to ground, the RF transistor 102 will operate at substantially the same percentage of saturated drain current. In other words, given that the RF transistor 102 has a drain current $I_{DRF}$ and a saturated drain current $I_{DSSRF}$, the $I_{DRF}/I_{DSSRF}$ ratio for RF transistor 102 will be substantially the same as the $I_D/I_{DSS}$ ratio for transistor 110.

With the presence of the voltage offset circuit 138, the above theory of operation becomes more complicated. Taking the example of implementation shown in FIGS. 1 and 2, the voltage at drain 132 of the transistor 110 can be expressed using above equation (6) for $I_D$, as follows:

$$V_{132}=-R_{114}*(I_{DSS}/(1+R_{122}*g_m)) \quad (8)$$

Thus, the voltage at terminal 140 can be expressed as:

$$V_{140}=-R_{114}*(I_{DSS}/(1+R_{112}*g_m)+\Delta \quad (9)$$

where $\Delta$ represents the forward voltage drop across the diode 116.

Assume for the purpose of simplicity that the RF transistor 102 is the same size as the reference transistor 110. Alternatively, the sizes may be different and scaling rules applied to the mathematical equations. Applying above equation (1), we derive:

$$I_{DRF}=-g_m*V_{th}+g_m*V_{gsRF} \quad (10)$$

$$I_{DRF}=I_{DSS}+g_m*V_{gsRF} \quad (11)$$

Since $V_{gsRF}=V_{140}$, we derive:

$$I_{DRF}=I_{DSS}+g_m*V_{140} \quad (12)$$

$$I_{DRF}=I_{DSS}+g_m*(-R_{114}*(I_{DSS}/(1+R_{112}*g_m)+\Delta) \quad (13)$$

$$I_{DRF}=I_{DSS}-g_m*I_{DSS}*R_{114}/(1+R_{112}*g_m)+g_m*\Delta \quad (14)$$

$$I_{DRF}=I_{DSS}(1-g_m*R_{114}/(1+R_{112}*g_m))+g_m*\Delta \quad (15)$$

As per equation (15), $I_{DRF}$ becomes independent of $I_{DSS}$, and depends only on the transistor $g_m$ and the diode drop $\Delta$, both of which are generally controllable, if:

$$(1-g_m*R_{114}/(1+R_{112}*g_m))=0 \quad (16)$$

$$g_m*R_{114}=1+R_{112}*g_m \quad (17)$$

$$R_{114}=1/g_m+R_{112} \quad (18)$$

Thus, for appropriate values of $R_{112}$ and $R_{114}$, equation (15) becomes:

$$I_{DRF}=g_m*\Delta \quad (19)$$

$$I_{DRF}=(-I_{DSS}/V_{th})*\Delta \quad (20)$$

$$I_{DRF}/I_{DSS}=\Delta/V_{th} \quad (21)$$

Note that the above theoretical calculations are only approximate calculations for the purpose of clarifying the operation of the bias circuit 100. Further, the calculations are for an ideal case, in that they overlook non-linearity and output conductance effects of the transistors. In practice, equation (17) does not result in independence of $I_{DRF}$ with respect to $I_{DSS}$ However, laboratory simulations reveal that there exist values of $R_{112}$, $R_{114}$ and the diode 116 voltage drop $\Delta$ that result in a substantially constant drain current condition through the transistor 102.

Thus the bias circuit 100 generates a $V_{140}$ which, when applied to the RF transistor 102, results in a constant $I_{DRF}/I_{DSS}$. Specifically, $V_{140}$ varies with $I_{DSS}$. If $I_{DSS}$ increases, due to process or temperature variations, $V_{140}$ becomes more negative, shutting off the transistor 102. However, current $I_{DRF}$ has increased, since for a constant $I_{DRF}/I_{DSS}$, $I_{DRF}$ must increase if $I_{DSS}$ increases.

In order to ensure that $I_{DRF}$ remains constant, with respect to process and temperature variations, $V_{140}$ must change at a faster rate as $I_{DSS}$ changes. Increasing the value of $R_{114}$ with respect to $R_{112}$ allows $V_{140}$ to exhibit a faster rate of change; however, changing the value of $R_{112}$ and $R_{114}$ also results in an incorrect absolute value of $V_{140}$ The error in the absolute value of $V_{140}$ is compensated by the DC voltage shift applied by the voltage offset circuit 138 or, in the above specific example of implementation, by the diode 116.

In a specific example of implementation, the circuit of FIG. 1 is implemented as per the following specifications:

transistor 102 conducts a 200.0 milliamps quiescent current nominally;

transistor 110 has a gate periphery of 100.0 micrometers, corresponding to a saturated drain current ($I_{DSS}$) of approximately 120.0 milliamps;

$V_{DD}$=5.0 volts;

$V_{SS}$=−5.0 volts;

resistor 112 is selected at 200.0 ohms;

resistor 114 is selected at 385.0 ohms; and resistor 130 is selected at 1000.0 ohms.

As described above, the bias circuit 100 biases the transistor 102 such that a substantially constant drain current $I_{DS}$ flows through the transistor 102 over temperature and process variations. An amplifier (or other high-frequency application to which the bias circuit 100 may be applied) tends to see a fixed, well-defined load resistance, and tends to run off of a fixed, well-defined voltage source. From Ohms Law, current equals voltage divided by resistance. If the voltage and resistance are fixed, then the current should also be fixed, as provided by constant current biasing. An advantage of constant current biasing is that the impedance for optimum power transfer at the output (taken at the drain terminal) of the biased transistor 102 is substantially constant, resulting in a consistent, optimum power output.

As a result of the topology of the bias circuit 100, the transistor 110 of the bias circuit 100 is operating at approximately the same fraction of $I_{DSS}$ (maximum current through the channel) of the transistor 102 as the biased transistor 102. Thus, the bias circuit 100 and the biased transistor 102 are operating over similar regimes, allowing them to track more efficiently over process variations.

The above description of a preferred embodiment under the present invention should not be read in a limitative manner as refinements and variations are possible without departing from the spirit of the invention. The scope of the invention is defined in the appended claims and their equivalents.

We claim:

1. A bias circuit for biasing a depletion mode power transistor, the power transistor having a drain terminal, a gate terminal and a source terminal, said bias circuit comprising:

a voltage offset circuit having an input and an output, said output for connection to the gate terminal of the power transistor, said voltage offset circuit operative to apply a constant DC voltage shift to an electrical signal at the input of said voltage offset circuit;

first and second power supply connections across which a voltage differential can be impressed for energizing said bias circuit;

a first transistor having a gate terminal coupled to said first power supply connection and a drain terminal coupled to the input of said voltage offset circuit;

a first resistor in an electrical pathway between a source terminal of said first transistor and said first power supply connection;

a second resistor in an electrical pathway between said drain terminal of said first transistor and a second power supply connection;

said bias circuit capable to generate a bias voltage at the output of said voltage offset circuit that, when applied to the gate terminal of the power transistor, causes establishment of a substantially constant drain current between the drain terminal and the source terminal of the power transistor.

2. A bias circuit as defined in claim 1, wherein said DC voltage shift is a positive DC voltage shift.

3. A bias circuit as defined in claim 2, wherein said DC voltage shift has a magnitude equal to the voltage across a PN junction of a semi-conductor device.

4. A bias circuit as defined in claim 3, wherein the semi-conductor device is a diode.

5. A bias circuit as defined in claim 1, wherein said voltage offset circuit includes a diode having an anode adapted for connection to the gate terminal of the power transistor and a cathode adapted for connection to said drain terminal of said first transistor.

6. A bias circuit as defined in claim 5, wherein said voltage offset circuit further includes a current supply circuit coupled to said diode, said current supply circuit operative to generate current to maintain said diode in a forward-biased mode.

7. A bias circuit as defined in claim 1, wherein said voltage offset circuit includes a second transistor having a drain terminal and a source terminal coupled together to said drain terminal of said first transistor and a gate terminal adapted for connection to the gate terminal of the power transistor.

8. A bias circuit as defined in claim 6, wherein said current supply circuit includes a third transistor having a gate terminal and a source terminal coupled to the output of said voltage offset circuit and a drain terminal coupled to said second power supply connection.

9. A bias circuit as defined in claim 8, wherein said current supply circuit further includes a fourth transistor having a gate terminal and a source terminal coupled to said first power supply connection and a drain terminal coupled to the input of said voltage offset circuit.

10. A bias circuit as defined in claim 9, wherein said current supply circuit further includes a diode coupled between said drain terminal of said third transistor and said second power supply connection.

11. A bias circuit as defined in claim 1, wherein said bias circuit biases the depletion mode power transistor such that the power transistor is characterized by an optimum power output level at its drain terminal.

12. A bias circuit as defined in claim 1, wherein said first transistor is a metal semiconductor field effect transistor.

13. A bias circuit as defined in claim 1, wherein said first transistor is a gallium arsenide metal semiconductor field effect transistor.

14. A bias circuit as defined in claim 1, wherein said first transistor is a metal-oxide semiconductor field effect transistor.

15. A bias circuit as defined in claim 1, wherein said first transistor is a junction field effect transistor.

16. An amplifier comprising:

first and second power supply connections across which a voltage differential can be impressed for energizing said amplifier;

a power transistor having a gate terminal coupled for receiving an input signal, a drain terminal coupled for providing an output signal and a source terminal coupled to said second power supply;

a bias circuit capable to generate a bias voltage that, when applied to the gate terminal of said power transistor, causes establishment of a substantially constant drain current between the drain terminal and the source terminal of said power transistor, said bias circuit including:

a) a voltage offset circuit having an input and an output, said output for connection to the gate terminal of said power transistor, said voltage offset circuit operative to apply a constant DC voltage shift to an electrical signal at the input of said voltage offset circuit;

b) a first transistor having a gate terminal coupled to said first power supply connection and a drain terminal coupled to the input of said voltage offset circuit;

c) a first resistor in an electrical pathway between a source terminal of said first transistor and said first power supply connection;

d) a second resistor in an electrical pathway between said drain terminal of said first transistor and said second power supply connection.

17. An amplifier as defined in claim 16, wherein said DC voltage shift is a positive DC voltage shift.

18. An amplifier as defined in claim 17, wherein said DC voltage shift has a magnitude equal to the voltage across a PN junction of a semi-conductor device.

19. An amplifier as defined in claim 18, wherein the semi-conductor device is a diode.

20. An amplifier as defined in claim 16, wherein said voltage offset circuit includes a diode having an anode adapted for connection to said gate terminal of said power transistor and a cathode adapted for connection to said drain terminal of said first transistor.

21. An amplifier as defined in claim 20, wherein said voltage offset circuit includes a current supply circuit coupled to said diode, said current supply circuit operative to generate current to maintain said diode in a forward-biased mode.

22. An amplifier as defined in claim 16, wherein said voltage offset circuit includes a second transistor having a drain terminal and a source terminal coupled together to said drain terminal of said first transistor and a gate terminal coupled to said gate terminal of said power transistor.

23. An amplifier as defined in claim 21, wherein said current supply circuit includes a third transistor having a gate terminal and a source terminal coupled to said output of said voltage offset circuit and a drain terminal coupled to said second power supply connection.

24. An amplifier as defined in claim 23, wherein said current supply circuit further includes a fourth transistor having a gate terminal and a source terminal coupled to said first power supply connection and a drain terminal coupled to said input of said voltage offset circuit.

25. An amplifier as defined in claim 24, wherein said current supply circuit further includes a diode coupled between said drain terminal of said third transistor and said second power supply connection.

26. A bias circuit as defined in claim 16, wherein, for a substantially constant drain current through said power transistor, said power transistor is characterized by an optimum power output level at said drain terminal of said power transistor.

27. An amplifier as defined in claim 16, wherein said power transistor is a gallium arsenide metal semiconductor field effect transistor.

28. An amplifier as defined in claim 16, wherein said first transistor is a metal semiconductor field effect transistor.

29. An amplifier as defined in claim 16, wherein said first transistor is a gallium arsenide metal semiconductor field effect transistor.

30. An amplifier as defined in claim 16, wherein said first transistor is a metal-oxide semiconductor field effect transistor.

31. An amplifier as defined in claim 16, wherein said first transistor is a junction field effect transistor.

32. A bias circuit for biasing a depletion mode power transistor, the power transistor having a drain terminal, a gate terminal and a source terminal, said bias circuit comprising:

first and second power supply connections across which a voltage differential can be impressed for energizing said bias circuit;

a diode having an anode for connection to the gate terminal of the power transistor and a cathode;

a current supply circuit coupled to said diode for generating current to maintain said diode in a forward-biased mode;

a first transistor having a gate terminal coupled to said firs power supply connection and a drain terminal coupled to the cathode of said diode;

a first resistor in an electrical pathway between a source terminal of said first transistor and said first power supply connection;

a second resistor in an electrical pathway between said drain terminal of said first transistor and said second power supply connection;

said bias circuit capable to generate a bias voltage that, when applied to the gate terminal of the power transistor, causes establishment of a substantially constant drain current between the drain terminal and the source terminal of the power transistor.

33. A bias circuit as defined in claim 32, wherein said diode is operative to apply a DC voltage shift to an electrical signal at the cathode of said diode.

34. A bias circuit as defined in claim 33, wherein said DC voltage shift is a positive DC voltage shift.

35. A bias circuit as defined in claim 34, wherein said current supply circuit includes a second transistor having a gate terminal and a source terminal coupled to the anode of said diode and a drain terminal coupled to said second power supply connection.

36. A bias circuit as defined in claim 35, wherein said current supply circuit further includes a third transistor having a gate terminal and a source terminal coupled to said first power supply connection and a drain terminal coupled to the cathode of said diode.

37. A bias circuit as defined in claim 36, wherein said current supply circuit further includes a diode coupled between said drain terminal of said second transistor and said second power supply connection.

38. A bias circuit as defined in claim 32, wherein the power transistor is a gallium arsenide metal semiconductor field effect transistor.

39. A bias circuit for biasing a depletion mode power transistor, the power transistor having a drain terminal, a gate terminal and a source terminal, said bias circuit comprising:

voltage offset means having input means and output means, said output means for connection to the gate terminal of the power transistor, said voltage offset means operative to apply a constant DC voltage shift to an electrical signal at the input means of said voltage offset means;

first and second power supply means across which a voltage differential can be impressed for energizing said bias circuit;

a first transistor having a gate terminal coupled to said first power supply means and a drain terminal coupled to said output means of said voltage offset means;

a first resistor in an electrical pathway between a source terminal of said first transistor and said first power supply means;

a second resistor in an electrical pathway between said drain terminal of said first transistor and said second power supply means;

said bias circuit capable to generate a bias voltage that, when applied to the gate terminal of the power transistor, causes establishment of a substantially constant drain current between the drain terminal and the source terminal of the power transistor.

40. A bias circuit for biasing a depletion mode power transistor, the power transistor having a drain terminal, a gate terminal and a source terminal, said bias circuit comprising:

a voltage offset circuit having an input and an output, said output for connection to the gate terminal of the power transistor, said voltage offset circuit operative to apply a constant DC voltage shift to an electrical signal at the input of said voltage offset circuit, the voltage shift having a magnitude equal to the voltage across a PN junction of a semi-conductor device;

first and second power supply connections across which a voltage differential can be impressed for energizing said bias circuit;

a first transistor having a gate terminal coupled to said first power supply connection and a drain terminal coupled to the input of said voltage offset circuit;

a first resistor in an electrical pathway between a source terminal of said first transistor and said first power supply connection;

a second resistor in an electrical pathway between said drain terminal of said first transistor and a second power supply connection;

said bias circuit capable to generate a bias voltage at the output of said voltage offset circuit that, when applied to the gate terminal of the power transistor, causes establishment of a substantially constant drain current between the drain terminal and the source terminal of the power transistor.

41. An amplifier comprising:

first and second power supply connections across which a voltage differential can be impressed for energizing said amplifier;

a power transistor having a gate terminal coupled for receiving an input signal, a drain terminal coupled for providing an output signal and a source terminal coupled to said second power supply;

a bias circuit capable to generate a bias voltage that, when applied to the gate terminal of said power transistor, causes establishment of a substantially constant drain current between the drain terminal and the source terminal of said power transistor, said bias circuit including:

a) a voltage offset circuit having an input and an output, said output for connection to the gate terminal of said power transistor, said voltage offset circuit operative to apply a constant DC voltage shift to an electrical signal at the input of said voltage offset circuit, the voltage shift having a magnitude equal to the voltage across a PN junction of a semiconductor device;

b) a first transistor having a gate terminal coupled to said first power supply connection and a drain terminal coupled to the input of said voltage offset circuit;

c) a first resistor in an electrical pathway between a source terminal of said first transistor and said first power supply connection;

d) a second resistor in an electrical pathway between said drain terminal of said first transistor and said second power supply connection.

* * * * *